(12) United States Patent
Saimen

(10) Patent No.: US 7,385,142 B2
(45) Date of Patent: Jun. 10, 2008

(54) MANUFACTURING METHOD OF ELECTRONIC PART AND WIRING SUBSTRATE

(75) Inventor: Munehide Saimen, Sakata (JP)

(73) Assignee: Seiko Epson Corporation (JP)

( * ) Notice: Subject to any disclaimer, the term of this patent is extended or adjusted under 35 U.S.C. 154(b) by 51 days.

(21) Appl. No.: 11/247,612

(22) Filed: Oct. 10, 2005

(65) Prior Publication Data

US 2006/0102382 A1 May 18, 2006

(30) Foreign Application Priority Data

Nov. 18, 2004 (JP) .............................. 2004-334404

(51) Int. Cl.
*H05K 1/00* (2006.01)
(52) U.S. Cl. .................. 174/250; 29/412; 29/831; 345/206; 439/495; 439/496
(58) Field of Classification Search ................ 174/250, 174/784; 409/291; 345/206; 439/495, 496; 29/412, 831
See application file for complete search history.

(56) References Cited

U.S. PATENT DOCUMENTS

| | | | | |
|---|---|---|---|---|
| 2,361,234 A | * | 10/1944 | Picard et al. ............... 409/291 |
| 4,411,982 A | * | 10/1983 | Shibuya et al. ............. 430/314 |
| 5,592,199 A | * | 1/1997 | Kawaguchi et al. ........ 345/206 |
| 6,089,905 A | | 7/2000 | Shimmyo et al. |
| 6,334,250 B1 | * | 1/2002 | Maeda et al. ................. 29/857 |
| 6,433,414 B2 | * | 8/2002 | Saito ........................... 257/684 |
| 6,555,755 B1 | | 4/2003 | Yanagisawa |
| 6,739,903 B1 | * | 5/2004 | Aoki et al. ................. 439/496 |
| 2003/0052703 A1 | * | 3/2003 | Terada et al. ............... 324/754 |
| 2005/0208824 A1 | * | 9/2005 | Kayama et al. ............. 439/495 |
| 2005/0253773 A1 | * | 11/2005 | Sekiguchi .................... 345/1.1 |

FOREIGN PATENT DOCUMENTS

| | | |
|---|---|---|
| JP | 10-135581 | 5/1998 |
| JP | 2000-124575 | 4/2000 |
| JP | 2000-286309 | 10/2000 |
| JP | 2001-148547 | 5/2001 |

* cited by examiner

*Primary Examiner*—Jeremy C. Norris
*Assistant Examiner*—Xiaoliang Chen
(74) *Attorney, Agent, or Firm*—Harness, Dickey & Pierce, P.L.C.

(57) ABSTRACT

A manufacturing method of an electronic part, comprises: sectioning a wiring substrate along a line intersecting a through hole, the wiring substrate having; a base substrate, a wiring pattern provided on a first surface of the base substrate, a reinforcement member provided on a second surface of the base substrate, and the through hole which is positioned so as to overlap partially an end of the reinforcement member and which extends through the base substrate.

9 Claims, 7 Drawing Sheets (A)

(B)

MANUFACTURING METHOD OF ELECTRONIC PART AND WIRING SUBSTRATE

BACKGROUND OF THE INVENTION

1. Technical Field

The invention relates to a manufacturing method of an electronic part and a wiring substrate.

2. Related Art

A wiring substrate using a film-shaped substrate is known. In this wiring substrate, to enable part thereof to be inserted into a connector and the like, a reinforcement plate was set up partially. As a method of forming the wiring substrate, it is currently known to section a base substrate and the reinforcement plate together after the reinforcement plate is set up on the base substrate.

Now, because the reinforcement plate is partially set up on the base substrate, in a process of sectioning the base substrate and the reinforcement plate, there is a need to section portions having different thicknesses. However, when sectioning portions having different thicknesses, a crack is sometimes generated on the base substrate. To produce a wiring substrate of high reliability, it is desirable to section a substrate in such a way as to cause no cracks in a portion, which is to become part of a product.

Japanese Unexamined Patent Publication No. 2000-286309 is an example of related art.

SUMMARY

An advantage of the invention is to provide an electronic part of high reliability and a wiring substrate which can be efficiently sectioned.

According to a first aspect of the invention, a manufacturing method of an electronic part includes: sectioning a wiring substrate along a line intersecting a through hole, the wiring substrate having; a base substrate, a wiring pattern provided on a first surface of the base substrate, a reinforcement member provided on a second surface of the base substrate, and the through hole which is positioned so as to overlap partially an end of the reinforcement member and which extends through the base substrate.

According to the invention, the wiring substrate is sectioned along the line intersecting the through holes extending through the base substrate. Consequently, a crack is prevented from being caused on the base substrate in a process of sectioning the wiring substrate, thereby enabling an electronic part of high reliability to be produced.

According to a second aspect of the invention, in the manufacturing method of an electronic part, the line may intersect an outer circumference of the reinforcement member within an area overlapping the through hole.

According to a third aspect of the invention, in the manufacturing method of an electronic part, the wiring pattern includes a plurality of wiring passing an area overlapping the reinforcement member. The line may intersect the wiring within the area overlapping the reinforcement member.

According to a fourth aspect of the invention, in the manufacturing method of an electronic part, the wiring substrate may be sectioned by shearing work along the line intersecting the through hole.

According to a fifth aspect of the invention, in the manufacturing method of an electronic part, an opening extending along the line may be formed by the shearing work on the wiring substrate.

According to a sixth aspect of the invention, in the manufacturing method of an electronic part, the shearing work may include urging from a side of the first surface an area in which the opening is formed on the wiring substrate.

According to a seventh aspect of the invention, in the manufacturing method of an electronic part, the wiring substrate having a first part surrounded by the line and a second part outside the line may include punching the first part from the wiring substrate by the shearing work.

According to an eighth aspect of the invention, in the manufacturing method of an electronic part, the shearing work may include urging from a side of the second surface an area surrounded by a side overlapping the through hole of the reinforcement member and the line.

According to a ninth aspect of the invention, in the manufacturing method of an electronic part, the wiring substrate may be sectioned by using a cutting tool along the line intersecting the through hole.

According to a tenth aspect of the invention, the wiring substrate includes: a base substrate, a wiring pattern provided on a first surface of the base substrate, and a reinforcement member provided on a second surface of the base substrate, wherein there is formed a through hole which is positioned so as to overlap partially the end of the reinforcement member.

According to the invention, it is possible to provide a wiring substrate which can be efficiently sectioned.

BRIEF DESCRIPTION OF THE DRAWINGS

The invention will be described with reference to the accompanying drawings, wherein like numbers refer to like elements, and wherein.

DESCRIPTION OF THE EMBODIMENTS

Embodiments to which the invention has been applied will now be described with reference to the drawings. It should be noted, however, that the invention is not limited to the following embodiments.

First Embodiment

FIGS. 1 through FIG. 9 are diagrams to explain a manufacturing method of an electronic part according to a first embodiment to which the invention has been applied.

The manufacturing method of an electronic part according to the embodiment may include preparation of a wiring substrate 10. A configuration of the wiring substrate 10 will now be described.

Figure 1:
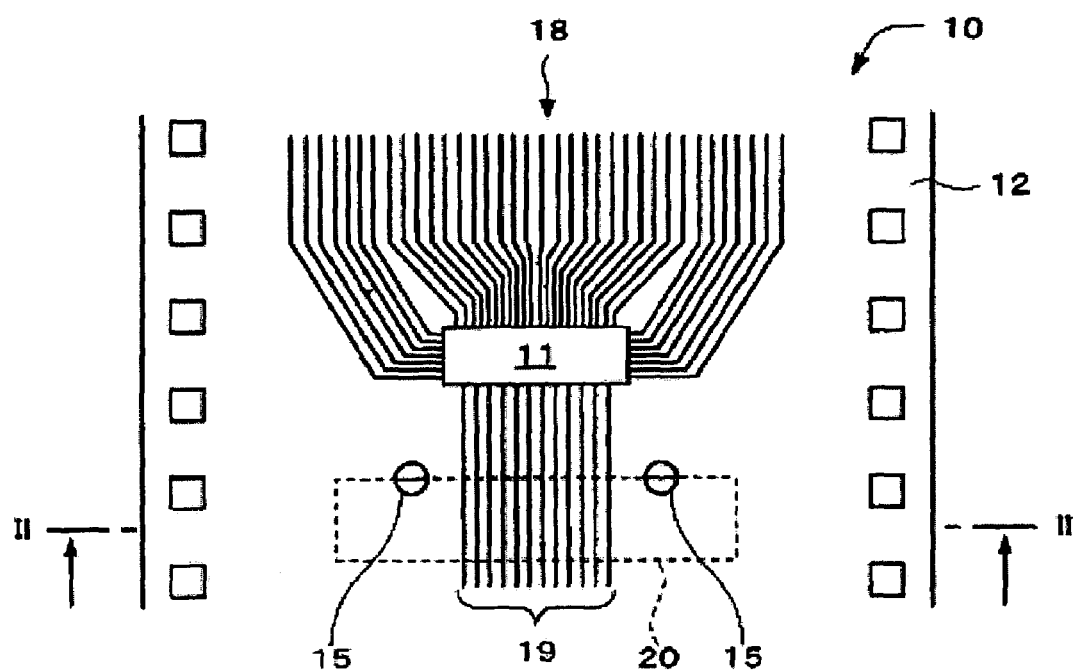
FIG. 1 is a diagram to explain a manufacturing method of an electronic part according to a first embodiment to which the invention has been applied.
Figure 2:
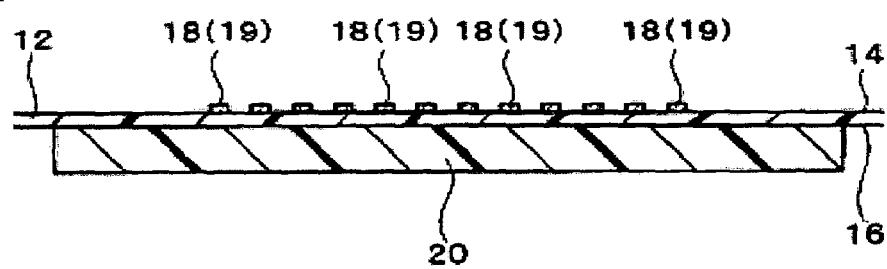
FIG. 2 is a diagram to explain a manufacturing method of an electronic part according to a first embodiment to which the invention has been applied.
Figure 3:
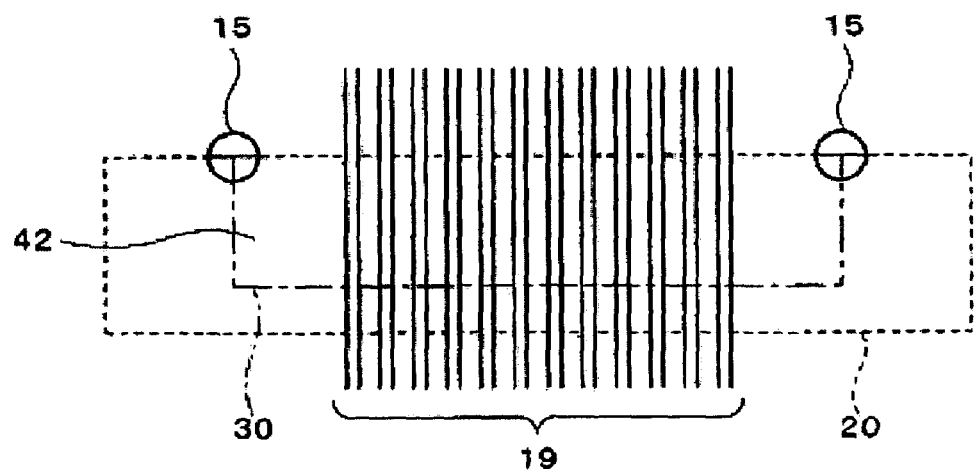
FIG. 3 is a diagram to explain a manufacturing method of an electronic part according to a first embodiment to which the invention has been applied.

FIGS. 1 through FIG. 3 are diagrams to explain the wiring substrate 10. FIG. 1 herein is a diagram showing an overall shape of the wiring substrate 10. FIG. 2 is a partially enlarged view of a section along line II-II of FIG. 1. Further, FIG. 3 is a partially enlarged view of FIG. 1.

The wiring substrate 10 has a base substrate 12 (refer to FIGS. 1 and 2). Materials and structures of the base material 12 are not particularly specified and any publicly known substrate may be used. The base substrate 12 may be a flexible substrate or it may be a rigid substrate. The base substrate may be a tape substrate. The base substrate may also be a substrate of a layer-built type or a single-layer substrate.

Further, exterior forms of the base substrate 12 are not particularly specified. A material of the base substrate 12 may be either an organic type or an inorganic type. It may also be composed of a complex structure of these types.

As the base substrate 12, for example, a substrate or a film constituted by polyethyleneterephthalate (PET) may be used. Or as the base plate 12, a flexible substrate made up of a polyimide resin may be used. As the flexible substrate, FPC (Flexible Printed Circuit) or a tape used in TAB (Tape Automated Bonding) technique may also be put to use.

The base substrate 12 includes a first surface 14 and a second surface 16 on an opposite side of the first surface 14 (refer to FIG. 2). Note that FIG. 1 is a diagram of the wiring substrate 10 observed from the side of the first surface 14. On the base substrate 12 are formed through holes 15 as shown in FIGS. 1 and 3. The through hole 15 is a hole which runs through the base substrate 12. The through hole 15 is arranged so as to partially overlap an end of a reinforcement member 20 to be explained later.

The wiring substrate 10 has a wiring pattern 18 (refer to FIG. 1 through FIG. 3). The wiring pattern 18 is provided on the first surface 14 of the base substrate 12. The wiring pattern 18 may be provided only on the surface (the first surface 14) of the wiring substrate 10. Note, however, that if a substrate of the layered-over type is used as the base substrate 12, the wiring substrate 10 may further have wiring provided inside the base substrate 12 (not illustrated).

If a tape-shaped substrate is used as the base substrate 12, a plurality of wiring patterns 18 may be provided on one base substrate 12 (not illustrated). Structures and materials of the wiring pattern 18 are not particularly specified, and any publicly known wiring may be used. For example, the wiring pattern 18 may be layered over by any of copper (Cu), chrome (Cr), titanium (Ti), nickel (Ni), titanium-tungsten (Ti—W), gold (Au), aluminum (Al), nickel vanadium (NiV), and tungsten (W), or formed by any one layer of these.

The wiring pattern 18 may, for example, be glued to the substrate 12 by way of an adhesive. Or the wiring pattern 18 may be directly glued to the first surface 14 of the base substrate 14 (refer to FIG. 2). The wiring pattern 18 may include a plurality of wiring 19 which pass through the area overlapping the reinforcement member 20 to be explained later (refer to FIG. 1). At this time, the wiring 19 may be arranged such as to pass between two through holes 15.

The wiring substrate 10 has the reinforcement member 20 (refer to FIG. 1 through FIG. 3). The reinforcement member 20 is provided on the second surface 16 of the base substrate 12. The reinforcement member 20 is a member to enable a terminal 48 (refer to FIG. 8) of an electronic part (an electronic part 2), which is formed by punching part of the wiring substrate 10, to be inserted into a connector. Since the terminal becomes difficult to be bent as the reinforcement member 20 complements a thickness of the base substrate 12, it becomes possible to insert the terminal into the connector.

The reinforcement member 20 may be crimped on the base substrate 12 by urging the reinforcement member 20 to the base substrate 12. Or the reinforcement member 20 may be glued to the base substrate 12 by way of an adhesive not illustrated. The reinforcement member 20 may also be arranged such that part of its end is exposed from the through holes 15 (refer to FIG. 1 and FIG. 3).

Methods of forming the wiring substrate 10 are not particularly specified. For example, after forming the through hole 15 on the base substrate 12, the reinforcement member 20 may be provided on the base substrate 12. Or after providing the reinforcement member 20 on the base substrate 12, the through hole 15 may be formed on the base substrate 12.

Materials of the reinforcement member 20 are not particularly specified. For example, the same material as the base substrate 12 may be used. Further, an outer form and a thickness of the reinforcement member 20 are not particularly specified.

A semiconductor chip 11 (refer to FIG. 1) may be mounted on the wiring substrate 10. At this time, with the semiconductor chip 11 in a condition of being mounted, the process of sectioning the wiring substrate 10 which is explained below may be carried out.

The manufacturing method of an electronic part according to the embodiment includes sectioning the wiring substrate along a line 30. By this method, a break 32 shown in FIG. 4 may be formed on the wiring substrate 10. As previously explained, the line 30 is, as shown in FIG. 3, a line intersecting the through holes 15. Consequently, by sectioning the wiring substrate 10 along the line 30, when sectioning the wiring substrate 10, it is possible to prevent a crack from generating on the base substrate 12.

The process of sectioning the wiring substrate 10 may be carried out by the shearing work. According to this method, even when sectioning the wiring substrate 10 through the shearing work, generation of cracks can be effectively prevented. Namely, as previously explained, there is the reinforcement member 20 provided on the wiring substrate 10, whereby in a portion overlapping the reinforcement member 20 and an area outside the reinforcement member 20, the thicknesses of the wiring substrate 10 are substantially different (refer to FIG. 2).

When shearing a wiring substrate having areas whose thicknesses varied, the base substrate 12 was stretched by a shearing jig to cause application of force upon the base substrate 12. Especially, when sectioning the area overlapping a periphery of the reinforcement member 20 or when sectioning continuously the area overlapping the reinforcement member 20 and the area outside it, the application of force occurred upon the base substrate 12.

Nevertheless, on the base substrate 12, there is formed the through holes 15 overlapping partially the end of the reinforcement member 20. And by the shearing work, the wiring substrate 10 is sectioned along the line 30 intersecting the through holes 15, hence, it is possible to prevent force from being applied to the base substrate 12 at the time of the shearing work.

Consequently, it is possible to prevent a crack from generating on the base substrate 12 at the time of the shearing work, thereby enabling electronic parts of high reliability to be produced. Note that as shown in FIG. 3, the line 30 may intersect the outer circumference of the reinforcement member 20 within the area overlapping the through holes 15.

Figure 4:
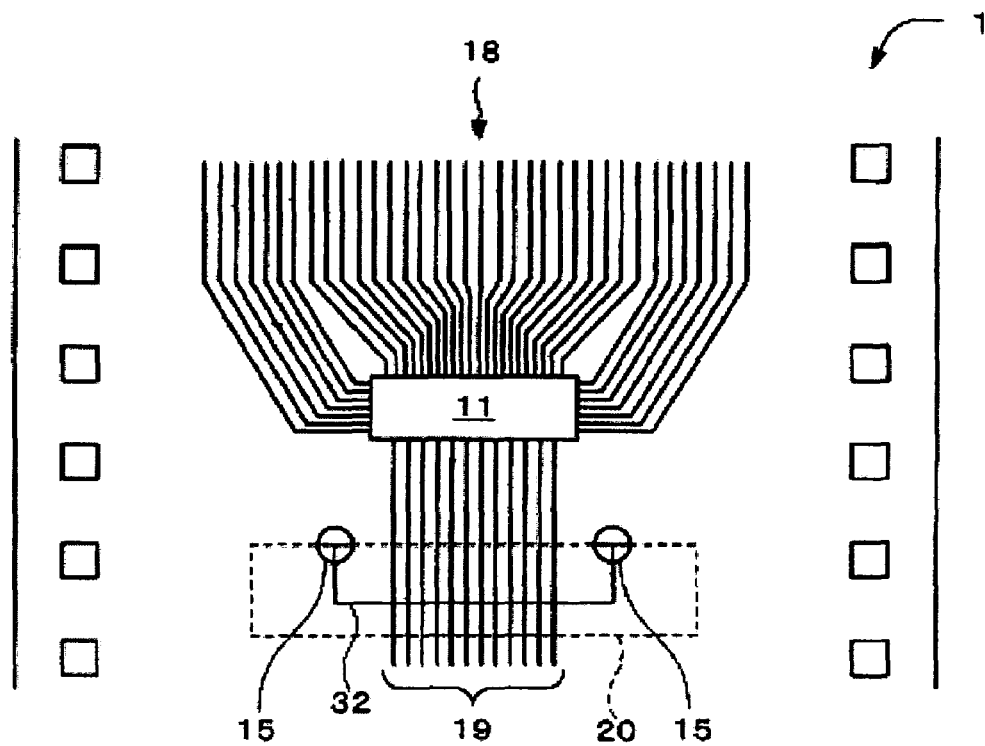
FIG. 4 is a diagram to explain a manufacturing method of an electronic part according to a first embodiment to which the invention has been applied.

Further, the line 30 may be a line having both ends. Namely, by means of the process, without punching the wiring substrate 10, the break 32 may be made in the wiring substrate 10 as shown in FIG. 4. According to this, in the latter process, too, the wiring substrate can be handled while in the condition of a tape, thus making it possible to perform the latter process efficiently.

It should be noted that the line 30 may be provided only within the area overlapping the reinforcement member 20 as shown in FIG. 3. Namely, in the process, sectioning of only within the area overlapping the reinforcement member 20 in the wiring substrate 10 may be carried out.

However, separately from this, the line 30 may be set up (not illustrated) in such a way as to bridge between inside the area overlapping the reinforcement member 20 and the area outside it (in a manner of spanning). Further, as shown in FIG. 3, the line 30 may intersect the wiring 19 inside the area overlapping the reinforcement member 20. At this time, the wiring 19 may be sectioned by the shearing work.

Figure 5:
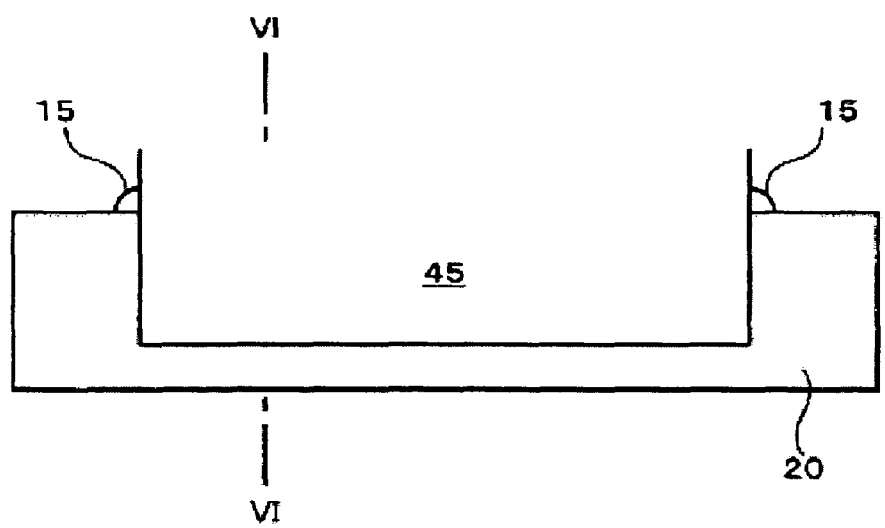
FIG. 5 is a diagram to explain a manufacturing method of an electronic part according to a first embodiment to which the invention has been applied.
Figure 6:
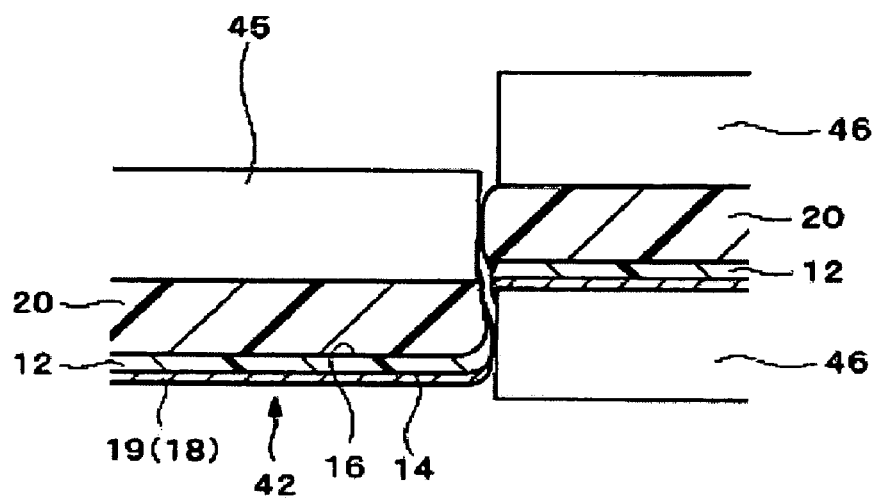
FIG. 6 is a diagram to explain a manufacturing method of an electronic part according to a first embodiment to which the invention has been applied.

As shown in FIGS. 5 and 6, the process may include urging an area 42 surrounded by a side overlapping the through holes 15 of the reinforcement member 20 and the line 30 from the second surface side 16; As shown in FIG. 6, while the area outside the area 42 is being held by the shearing jig 46, the shearing work may be carried out.

It should be noted that the area 42 is an area which is supposed to become the terminal 48 of an electronic part (electronic part 2 to be explained later) punched from the wiring substrate 10. According to this method, as shown in FIG. 6, the wiring 19 is sectioned while being urged to the base substrate 12 inside the area 42.

As a result, at the end of the terminal 48, it can be made difficult for the base substrate 12 and the wiring 19 to come off from each other. Consequently, an electronic part 1 of high reliability can be manufactured. Note that FIGS. 5 and 6 are diagrams to explain a process of shearing the wiring substrate 10. At this point, FIG. 6 is a partial enlarged view of a section along line VI-VI in FIG. 5. Further, in FIG. 5, for the sake of simplicity, the shearing jig 46 is omitted.

Note that a cutting tool may be used to carry out the process of sectioning the wiring substrate 10. At this time, as the cutting tool, a Thomson type, an engraving type, a pinnacle type and the like may be used. By applying any of these types to the substrate 10 and applying pressure to the cutting tool and pushing to section the substrate 10, the wiring substrate 10 may be sectioned. The break 32 may be formed on the wiring substrate 10 by this method.

Figure 7:
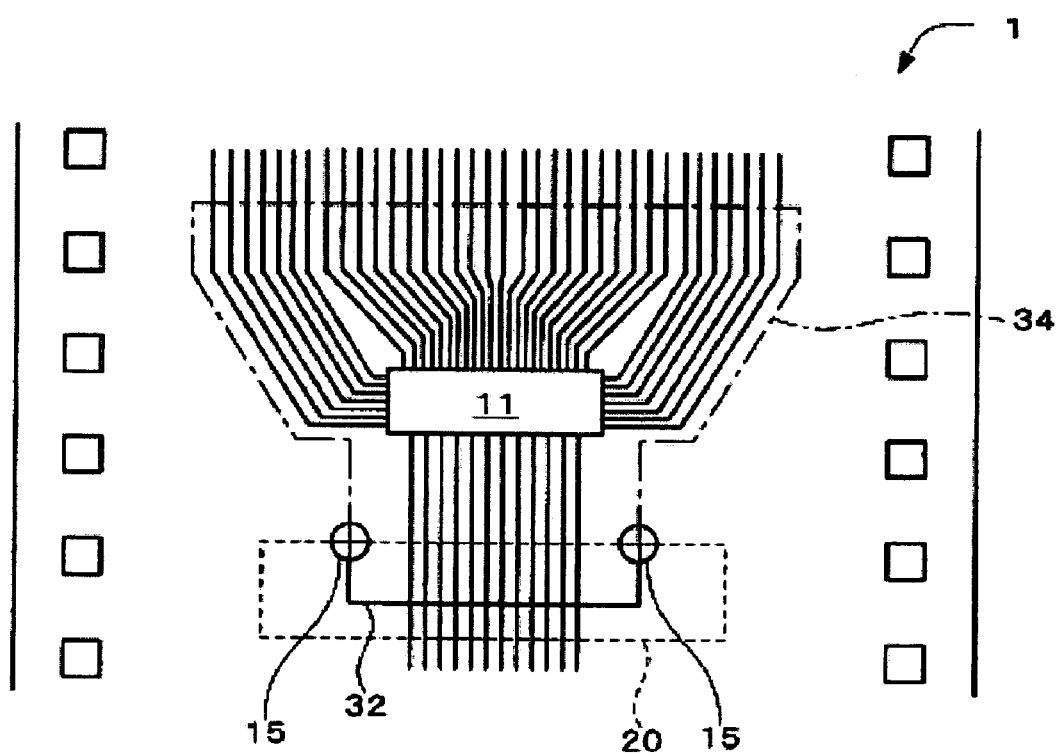
FIG. 7 is a diagram to explain a manufacturing method of an electronic part according to a first embodiment to which the invention has been applied.

The manufacturing method of an electronic part according to the embodiment may further include a process of punching part of the electronic part 1. The electronic part 1 may be sheared and part of it may be punched. At this time, as shown in FIG. 7, part of the electronic part 1 may be punched along a line 34. The line 34, as shown in FIG. 7, may be extended to the break 32. Further, the line 34 may intersect the through holes 15.

Figure 8:
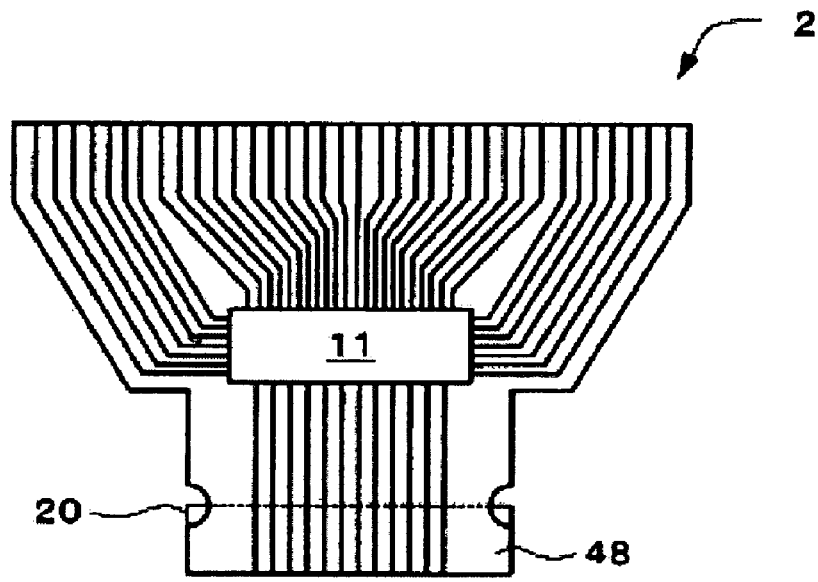
FIG. 8 is a diagram to explain a manufacturing method of an electronic part according to a first embodiment to which the invention has been applied.

An electronic part 2 shown in FIG. 8 may be manufactured according to the process. As previously explained, since the through holes 15 are formed on the base substrate 12, it is possible to punch the electronic part 2 from the electronic part 1 so as not to generate a crack. Consequently, the electronic part 2 of high reliability can be produced.

The semiconductor chip 11 may be mounted on the electronic part 2. At this time, the electronic part 2 may be called a semiconductor device. The semiconductor chip 11 may be mounted on the wiring substrate 10, and at this time, the above-referenced shearing work may be applied to the wiring substrate mounted with the semiconductor chip 11. However, separately from this, after carrying out the shearing work, the semiconductor chip 11 may be mounted. At this time, the above-referenced shearing work may be applied to the wiring substrate 10 having no semiconductor chip.

Figure 9:
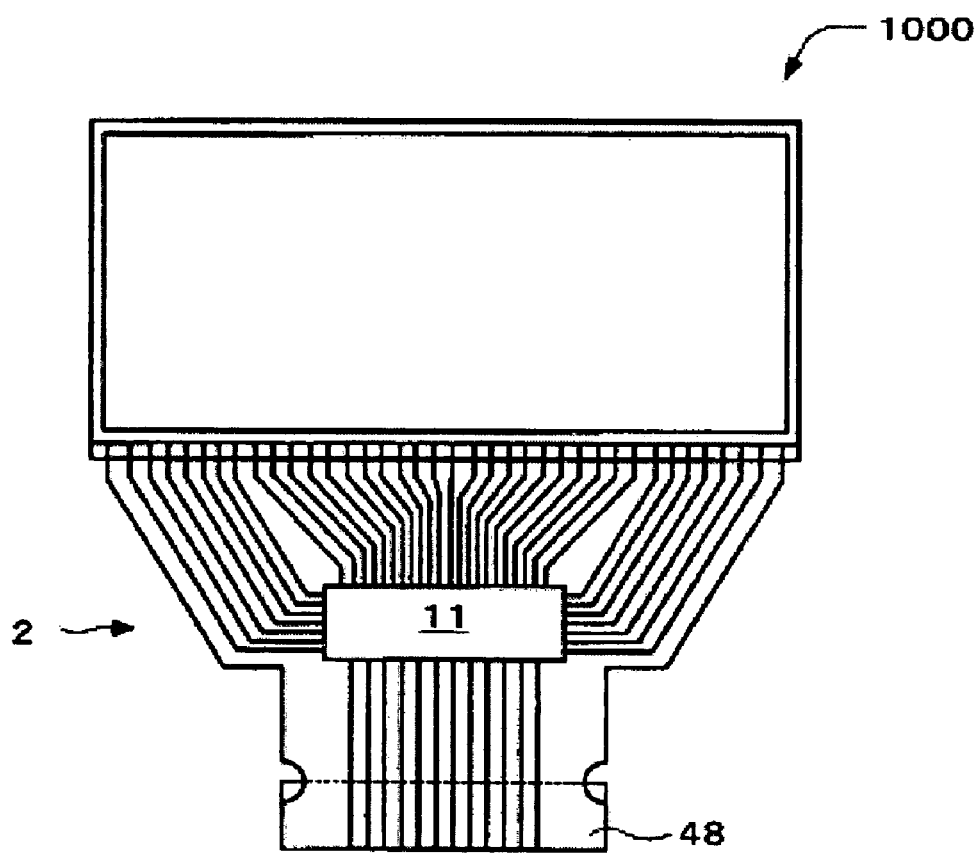
FIG. 9 is a diagram showing an electronic module having an electronic part manufactured by a method according to an embodiment to which the invention has been applied.
Figure 10:
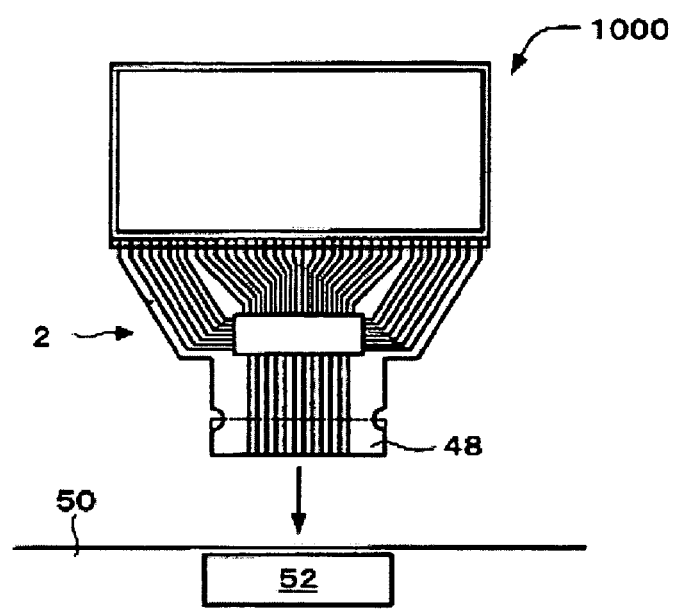
FIGS. 10A and 10B are diagrams to explain how to connect an electronic part, which is manufactured by a method according to an embodiment to which the invention has been applied, to a circuit substrate.
Figure 10:
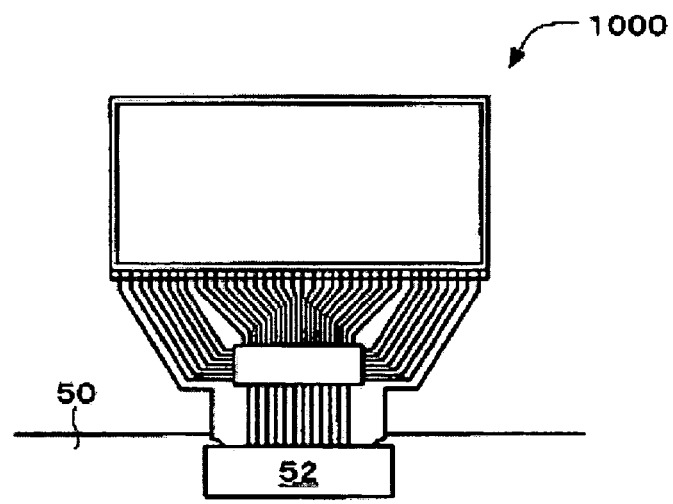

Now, an electronic module 1000 having the electronic part 2 is shown in FIG. 9. The electronic module 1000 may be a display device. The display device may be, for example, a liquid crystal display device and an El (Electrical Luminescence) display device. As shown in FIGS. 10A and 10B, the electronic module 1000 is capable of electrically connecting to a circuit substrate 50 by using the terminal 48. At this time, as shown in FIGS. 10A and 10B, by inserting the terminal 48 into a connector 52 of the circuit substrate 50, an electrical and physical connection between the electronic module 1000 and the circuit substrate may be realized.

Figure 11:
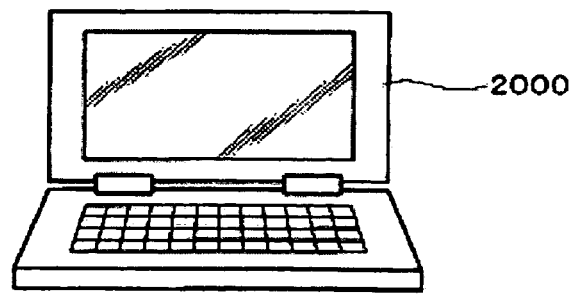
FIG. 11 is a diagram showing electronic equipment having an electronic part manufactured by a method according to an embodiment to which the invention has been applied.
Figure 12:
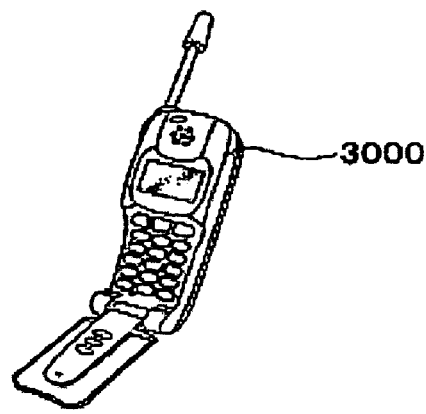
FIG. 12 is a diagram showing electronic equipment having an electronic part manufactured by a method according to an embodiment to which the invention has been applied.

As previously explained, since the reinforcement member 20 is provided on the terminal 48, this can be easily inserted into the connector 52. And as electronic equipment having the electronic part 2, there are respectively shown a laptop personal computer 2000 in FIG. 11 and a mobile phone 3000 in FIG. 12.

Second Embodiment

Figure 13:
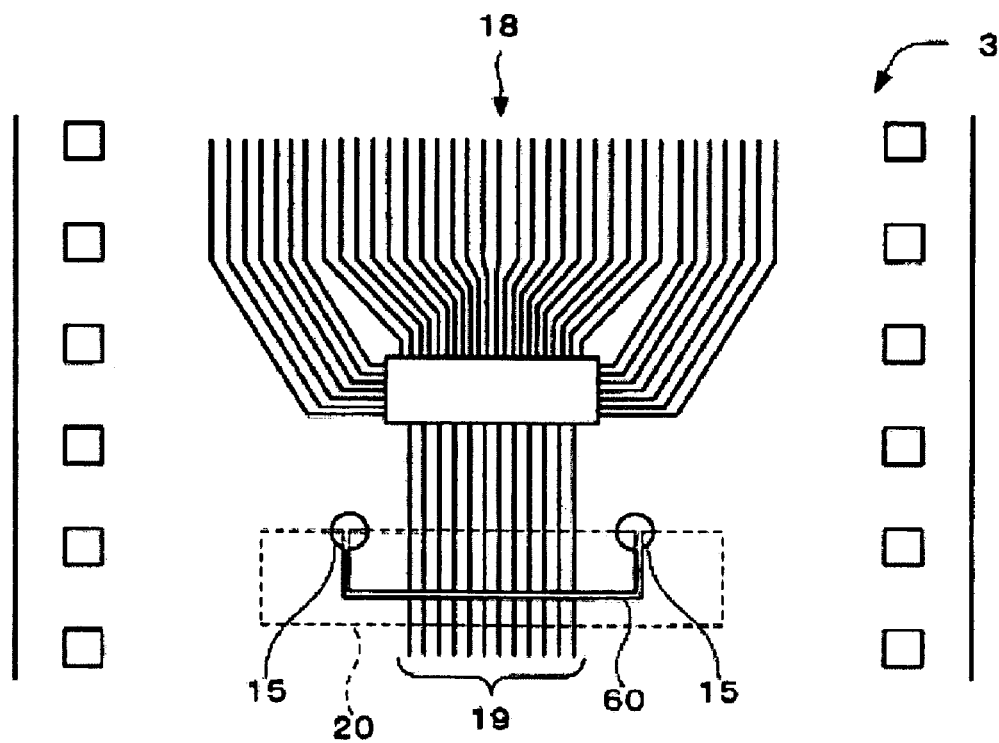
FIG. 13 is a diagram to explain a manufacturing method of an electronic part according to a second embodiment to which the invention has been applied.

FIG. 13 is a diagram to explain a manufacturing method of an electronic product according to a second embodiment to which the invention has been applied.

The manufacturing method of an electronic product according to the embodiment includes sectioning the wiring substrate 10 along the line 30. By means of the process, an opening 60 extending along the line 30 is formed on the wiring substrate 10. An electronic part 2 shown in FIG. 13 may be manufactured by this. As previously explained, the line 30 intersects the through holes 15. Consequently, the opening 60 may be formed so that a crack will not generate on the base substrate 12, thus enabling electronic parts of high reliability to be manufactured. As shown in FIG. 13, the opening 60 may be formed only on the area overlapping the reinforcement member.

But, separately from this, the opening may be formed (not illustrated) in such a way as to bridge the area overlapping the reinforcement member 20 and the area outside it (in a manner of spanning).

The process of sectioning the wiring substrate 10 may be carried out by the shearing work. And if the line 30 intersects the wiring 19 (refer to FIG. 3), the shearing work may include urging an area, in which the opening 60 is formed on the wiring substrate 10, from the first surface 14 side. This enables an electronic part of high reliability, whose wiring 19 is difficult to come off, to be manufactured.

At this time, shearing work may be carried out by a shearing jig whose tip has the same shape as the opening 60. However, a process of forming the opening 60 may be carried out by using a cutting tool. At this time, as the cutting tool, the Thomson type, the engraving type, the pinnacle type and the like may be used. By applying any of these types to the substrate 10 and applying pressure to the cutting tool, the wiring substrate 10 may be sectioned. The opening 60 may be formed by this method.

The manufacturing method of an electronic part according to the embodiment may further include subjecting the electronic part 3 to shearing work and punching part of the electronic part 3. At this time, part of the electronic part 3 may be punched along a line which communicates with the opening 60 (not illustrated). By punching part of the electronic part 3, the electronic part 2 may be manufactured (refer to FIG. 8).

Third Embodiment

Figure 14:
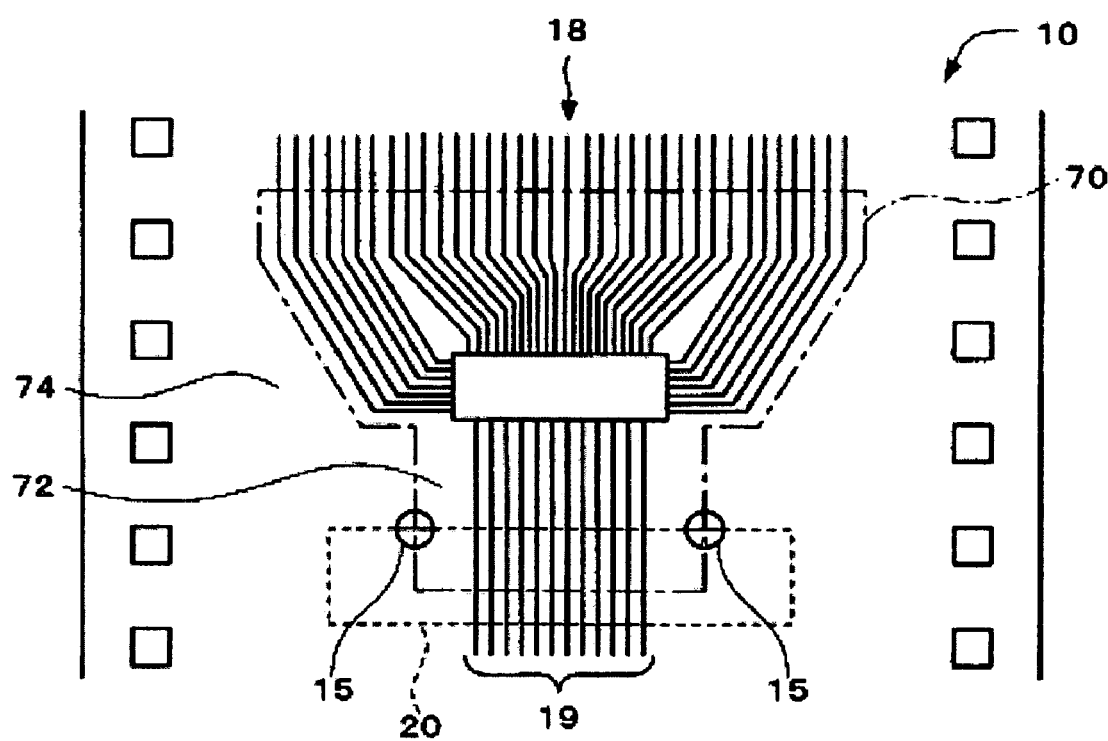
FIG. 14 is a diagram to explain a manufacturing method of an electronic part according to a third embodiment to which the invention has been applied.

FIG. 14 is a diagram to explain a manufacturing method of an electronic part according to a third embodiment to which the invention has been applied.

The manufacturing method of an electronic product according to the embodiment includes sectioning the wiring substrate 10 along a line 70 intersecting the through holes 15. The wiring substrate 10 includes a first portion 72 surrounded by the line 70 and a second portion 74 outside the line 70. Namely, the line 70 can be said as an encircling line surrounding the first portion 72. And the wiring substrate 10 is sectioned to cut out the first portion 72 from the wiring substrate 10. The electronic part 2 may be manufactured by this method (refer to FIG. 8).

As shown in FIG. 14, the line 70 intersects the through holes 15. Consequently, a crack is prevented from generating on the base substrate 12 when sectioning the wiring substrate 10. The process of sectioning the wiring substrate may be carried out by the shearing work. At this time, urging the first portion 72 by the shearing jig from the second surface 16 side may be included.

The first portion 72 may be urged from the second surface 16 side by the shearing jig whose tip has the same shape as the first portion 72.

By urging the first portion 72 from the second surface 16 side, it is possible to manufacture an electronic part of high reliability whose wiring 19 is difficult to come off. Nevertheless, the process of sectioning the wiring substrate 10 may be carried out by using a cutting tool. At this time, the Thomson type, the engraving type, the pinnacle type and the like may be used as the cutting tool. By applying any of these types of the cutting tools to the substrate 10, applying pressure to the cutting tool and pushing to section the substrate 10, the wiring substrate 10 may be sectioned.

It should be noted that the invention is not limited to the above-referenced embodiments, but a variety of modifications are possible. For example, the invention includes virtually the same construction (for example, the same construction of function, method, and effect or the same construction of purpose and effect) as the construction described in the embodiments. Further, the invention includes a construction which brings about the same operation/working-effect or the construction which can accomplish the same purpose as the construction described in the embodiments. Furthermore, the invention includes a construction which added publicly known techniques to the construction explained in the embodiments.

What is claimed is:

1. A manufacturing method of an electronic part, comprising:
    sectioning a wiring substrate along a line intersecting a through hole, the wiring substrate having;
    a base substrate,
    a wiring pattern provided on a first surface of the base substrate,
    a reinforcement member provided on a second surface opposite to the first surface of the base substrate, and
    the through hole that is positioned so as to overlap partially an end of the reinforcement member and extends through the base substrate.

2. The manufacturing method of an electronic part according to claim 1, wherein the line intersects an outer circumference of the reinforcement member within an area overlapping the through hole.

3. The manufacturing method of an electronic part according to claim 1, wherein the wiring pattern includes a plurality of wiring passing through an area overlapping the reinforcement member, and the line intersects the wiring within the area overlapping the reinforcement member.

4. The manufacturing method of an electronic part according to claim 1, wherein the wiring substrate is sectioned by shearing work along the line intersecting the through hole.

5. The manufacturing method of an electronic part according to claim 4, wherein an opening extending along the line is formed by the shearing work on the wiring substrate.

6. The manufacturing method of an electronic part according to claim 5, wherein the shearing work includes urging from a side of the first surface an area in which the opening is formed on the wiring substrate.

7. The manufacturing method of an electronic part according to claim 4, wherein the wiring substrate having a first part surrounded by the line and a second part outside the line includes punching the first part from the wiring substrate by the shearing work.

8. The manufacturing method of an electronic part according to claim 4, wherein the shearing work includes urging from a side of the second surface an area surrounded by a side overlapping the through hole of the reinforcement member and the line.

9. The manufacturing method of an electronic part according to claim 1, wherein the wiring substrate is sectioned by using a cutting tool along the line intersecting the through hole.

* * * * *